United States Patent [19]

Pecorino

[11] Patent Number: 4,533,869
[45] Date of Patent: Aug. 6, 1985

[54] FIELD TEST INSTRUMENT FOR HORIZONTAL OUTPUT CIRCUITS

[76] Inventor: Martin C. Pecorino, 2398 Coral Way, Largo, Fla. 33341

[21] Appl. No.: 503,593

[22] Filed: Jun. 13, 1983

[51] Int. Cl.³ ..................... G01R 31/28; H04N 7/02
[52] U.S. Cl. ..................... 324/158 R; 324/123 R; 358/139
[58] Field of Search ............ 324/158 F, 158 R, 73 R, 324/123 R; 358/139

[56] References Cited

U.S. PATENT DOCUMENTS

| | | | |
|---|---|---|---|
| 1,954,305 | 4/1934 | Williams | 324/404 |
| 2,631,187 | 3/1953 | Bunker | 324/73 R |
| 4,329,643 | 5/1982 | Neumann et al. | 324/158 F |

*Primary Examiner*—Stewart J. Levy
*Assistant Examiner*—Stephen M. Baker
*Attorney, Agent, or Firm*—Ronald E. Smith

[57] ABSTRACT

This field test instrument serves to home test the horizontal output circuits of television, so as to indicate if the circuit of the set is operating normally. Primarily, it consists of a housing with a circuit, which includes an ammeter, a pair of transistors, a circuit breaker, and a cable with an adapter jack, for placement into horizontal heat sink socket. The instrument further serves to indicate if the set is drawing too much current, and will let the technician know if it is safe to put in a replacement transistor, without having to take the set to the shop for repairs.

1 Claim, 3 Drawing Figures

FIELD TEST INSTRUMENT FOR HORIZONTAL OUTPUT CIRCUITS

This invention relates to electronic instruments, and more particularly, to a field test instrument for horizontal output circuits.

The principal object of this invention is to provide a field test instrument for horizontal output circuits, which will enable the technician to check the horizontal output of a television circuit, while the set is in the home.

Another object of this invention is to provide a field test instrument for horizontal output circuits, which will indicate to the technician if the circuit is operating normally, or whether it is drawing excessive current.

Another object of this invention is to provide a field test instrument for horizontal output circuits, which will serve to rid the technician of the worry of damage to the replacement transistor.

A further object of this invention is to provide a field test instrument for horizontal output circuits. which will enable the technician to know whether it is safe to replace the transistor in the home, or to take the television set to the shop for repairs, without damaging the parts, and the instrument will be small and light in weight, for easy carrying.

Other objects are to provide a field test instrument for horizontal output circuits, which is simple in design, inexpensive to manufacture, rugged in construction, easy to use, and efficient in operation.

These, and other objects, will be readily evident, upon a study of the following specification, and the accompanying drawings, wherein.

Figure 1:
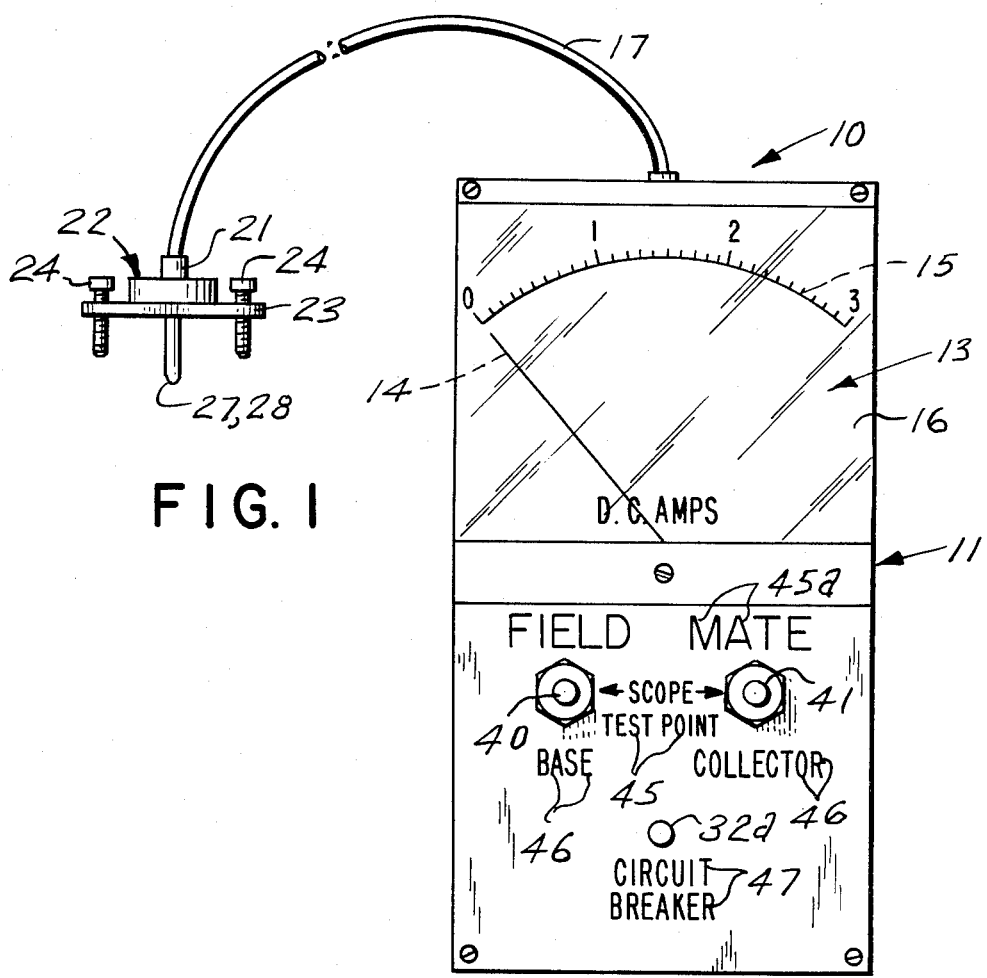
FIG. 1 is a front elevational view of the present invention.
Figure 2:
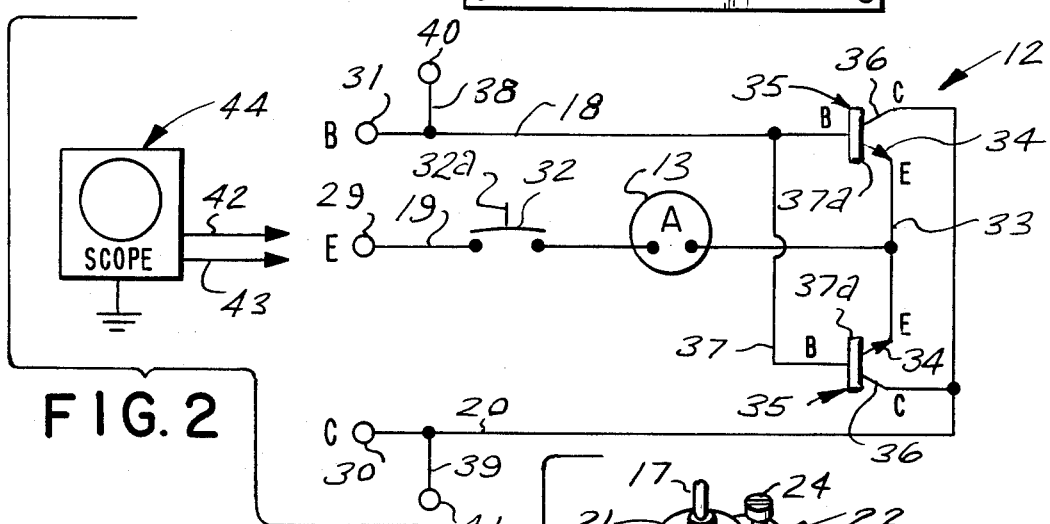
FIG. 2 is a schematic wiring diagram of the circuit of the invention.
Figure 3:
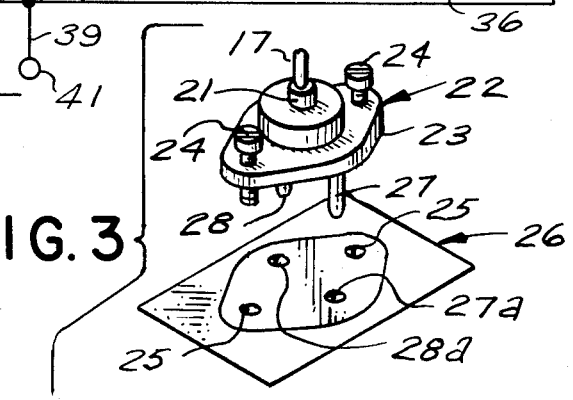
FIG. 3 is an enlarged perspective view of the adapter test plug, shown removed from the invention, and is illustrated prior to entry into the transistor socket.

Accordingly, a test instrument 10 is shown to include a hollow housing 11, having a circuit 12 suitably secured on its interior, in a manner which is common in the art, and not shown. An ammeter 13 is secured in housing 11, and its pointer arm 14 serves to read on a calibrated scale 15, through the face 16 of housing 11. A cable 17 is suitably secured to the top of housing 11, and cable 17 contains wires 18, 19, and 20, which hereinafter will be described. The opposite end of cable 17 is suitably secured in the neck 21 of transistor adapter 22, which includes a base plate 23, and a pair of screws 24, which are received in the socket openings 25 of a horizontal heat sink socket 26 of the television set. A pair of prongs 27 and 28 are fixedly secured in adapter 22 in a suitable manner, and are each connected to their respective contact terminals 29 and 30, the terminal 29 indicating the emitter terminal, and the terminal 30 indicating the collector terminal. The base plate 23 is electrically secured to the base terminal 31 of circuit 12, and prong 27, of adapter 22, is received in opening 27a of socket 26, while prong 28 is simultaneously received in opening 28a of socket 26. Wire 19, having the emitter contact 29 at one end, is wired in series with a circuit breaker 32, the ammeter 13, and is terminated at a connection in the middle of wire 33, which is connected, at each end, to the emitters 34 of a pair of transistors 35. The collectors 36, of transistors 35, are connected to wire 20, which is terminated, at its end, by collector terminal 30. A wire 37 is connected, at one end, to the base 37a of one transistor 35, and is connected, at its opposite end, to the base 37a of the other transistor 35 of the pair, and a wire 38 is secured, at one end, to wire 18, and is secured, at its opposite end, to terminal jack 40. Another wire 39 is secured to wire 20, at one end, and is secured, at its opposite end, to terminal jack 41, and jacks 40 and 41 are the test points for receiving their respective leads 42 and 43 of an oscilloscope 44, which is used for a visual circuit check, when desired.

The face 16 of housing 11 includes letter characters 45, for indication of the placement for the oscilloscope 44, and letter characters 45a serve to indicate the name of the instrument. Letter characters 46 serve to indicate the base and collector jacks 40 and 41, respectively, and letter characters 47 serve to indicate the circuit breaker button 32a of circuit breaker 32.

In use, the transistor of the television circuit that is in question, is removed, and adapter 22 is plugged into the socket 26. With the television circuit turned on, the technician will be able to tell if the horizontal circuit, being tested, is drawing too much current, by reading the graduated scale 15 of instrument 10, and for a shop check, the leads 42 and 43 of the oscilloscope are put onto the jacks 40 and 41, for visual read-out.

While various changes may be made in the detail construction, it is understood that such changes will be within the spirit and scope of the present invention, as is defined by the appended claims.

What I claim as new is:

1. A field test instrument for horizontal output circuits, comprising, a housing, a cable having its proximal end secured to said housing, an adapter having a base plate secured to the distal end of said cable, a transistor circuit secured in said housing, an ammeter secured in said circuit, a circuit breaker secured in said circuit, said ammeter being electrically connected in series to said circuit breaker, said ammeter being electrically connected to the emitters of a pair of transistors in said circuit, the bases of said pair of transistors being electrically connected to each other, the base of one of said pair of transistors being electrically connected to a first terminal secured to the base plate of said adapter, the collectors of said pair of transistors being electrically connected to a second terminal secured to a first prong of said adapter, and a second prong of said adapter being electrically connected to a third terminal, which third terminal is electrically connected to said circuit breaker, whereby said adapter, when plugged into a horizontal output circuit socket of a television set, closes said output circuit with said ammeter and said pair of transistors, to give a reading of current upon the face of said ammeter, which reading will indicate if a replacement transistor should be inserted into said output circuit socket.

* * * * *